(12) United States Patent
Nishii et al.

(10) Patent No.: US 6,365,844 B2
(45) Date of Patent: *Apr. 2, 2002

(54) PRINTED WIRING BOARD

(75) Inventors: Toshihiro Nishii; Shigeru Yamane, both of Hirakata; Shinji Nakamura, Katano; Hidenori Hayashi, Osaka; Toru Fujimoto, Katano; Toshiharu Okada, Ibaraki; Izuru Nakai, Toyonaka, all of (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,020

(22) Filed: Feb. 10, 1999

(51) Int. Cl.[7] ................................................. H05K 1/11
(52) U.S. Cl. .......................... 174/264; 174/266; 29/852; 219/121.71
(58) Field of Search ................................. 174/261, 262, 174/263, 264, 265, 266; 29/830, 846, 852; 219/121.7, 121.71; 428/901; 156/272.8

(56) References Cited

U.S. PATENT DOCUMENTS

| | | | |
|---|---|---|---|
| 5,194,713 A | * | 3/1993 | Egitto et al. ............ 219/121.71 |
| 5,220,135 A | * | 6/1993 | Kawakami et al. .......... 174/264 |
| 5,314,742 A | * | 5/1994 | Kirayoglu et al. .......... 428/901 |
| 5,319,159 A | * | 6/1994 | Watanabe et al. ........... 174/262 |
| 5,378,869 A | * | 1/1995 | Marrs et al. ............ 219/121.71 |
| 6,090,330 A | * | 7/2000 | Gawa et al. ............ 219/121.71 |

* cited by examiner

Primary Examiner—Michael A. Tolin
(74) Attorney, Agent, or Firm—Rossi & Associates

(57) ABSTRACT

In manufacturing a double-layered or a multi-layered printed wiring board, a layer of metamorphic substance, which is created by transmuting a substrate material, is formed on an inner wall of a hole during a perforation process of the substrate utilizing radiation energy. The layer of metamorphic substance prevents conductive materials constituting electrical connection means formed on the inner wall of the hole from dispersing over a surface of the substrate or permeating into the substrate.

7 Claims, 14 Drawing Sheets

PRINTED WIRING BOARD

FIELD OF THE INVENTION

The present invention relates to a printed wiring board for use in a various kinds of electronic equipments, and a method of and an apparatus for manufacturing the same.

BACKGROUND OF THE INVENTION

Double-layered printed wiring boards and multi-layered printed wiring boards enabling a high-density mounting are being spread widely for adoption in electronic equipments along with reduction in size and increase in density of the electronic equipments through the years. In manufacturing process of the double-layered printed wiring boards and the multi-layered printed wiring boards, in the past, drilling has been used to form through holes and blind holes in a substrate. In recent years, however, a new perforation method utilizing a laser beam is emerging as a process capable of making finer holes at higher speed, as disclosed in Japanese Patent Laid-Open Publication, No. H09-107168.

In the prior art perforation method utilizing a laser beam, generally the work has been performed according to a specification for a total amount of radiation energy to be irradiated in a unit area of a substrate. However, there have been cases where dispersion occurs as a result of the work depending on a radiating apparatus, even though the total amount of radiation energy is maintained constant.

Further, another perforation method of the prior art utilizing a laser adopts a process in that a substrate material, as a working object, is evaporated instantaneously in the shortest possible time by irradiating the substrate material with a laser beam having with an enhanced peak energy on the substrate material, in order to reduce an effect of heat to a circumjacent area of the part being processed. However, if the prior art method of laser processing is applied to a substrate having porous structure, a cavity 1a leading to an interior of the substrate can develop in an inner wall of the through hole, as shown in FIG. 15B.

Since a purpose of making the through hole is to form an electric conductive means in the through hole by plating, or by using a conductive paste or the like material for making an electrical contact between an upper and a lower surfaces of the substrate, a development of the cavity 1a leading to an interior of the substrate causes a problem of deteriorating an insulation property of the printed wiring board around the through hole due to an entry of the plated membrane or the conductive paste, as shown in FIG. 16A. A further problem occurs that reliability of the printed wiring board is impaired, if the cavity 1a is present near the surface of the substrate, because a material composing the electric conductive means spreads around the through hole on the surface of the printed wiring board as shown in FIG. 16B.

For the above reasons, the present invention aims at providing a printed wiring board having high density and high reliability, and also a method and an apparatus for manufacturing the printed wiring board of high density and high reliability without decreasing the speediness of the laser processing in the work of perforating the printed wiring board.

SUMMARY OF THE INVENTION

The present invention relates to a double-layered and a multi-layered printed wiring board provided with electrical connection means interconnecting a plurality of circuits through a through hole or a blind hole formed in a substrate material in order to connect the circuits constructed with a plurality of metal foils sandwiching an insulation substrate, and a method and an apparatus for manufacturing the same. In the manufacturing process of the printed wiring board of the present invention, the printed wiring board is provided with a preventive means on an inner wall of the through hole or the blind hole for preventing conductive materials constituting the electrical connection means from spreading or permeating into or over the surface of the substrate material.

DESCRIPTION OF THE PREFERRED EMBODIMENTS

Referring now to FIG. 1 through FIG. 14, preferred embodiments of the present invention will be described hereinafter with an example using a substrate material made of a composite of aromatic polyamide fiber (i.e., aramid fiber) and thermosetting resin.

FIRST EXEMPLARY EMBODIMENT

FIGS. 1A through 1F are cross sectional views of an area around a through hole, depicting a manufacturing process of a printed wiring board of a first exemplary embodiment of the present invention. In FIG. 1, a substrate material 11 constituting a base material of the printed wiring board is a composite material composed of epoxy resin 12, which is a kind of thermosetting resin, and aramid fiber 13. These materials are normally used in a state that the epoxy resin is partially polymerized, which is usually called "B-stage" in the printed wiring board manufacturing industry. A composite of polymeric resin and fiber in a state of the B-stage is commonly called a "prepreg", which is commercially available. The prepreg is generally a porous substance containing numerous pores in it. The aramid fiber can be either in a woven form or non-woven form for use in the prepreg. Although aramid fiber is used for the fiber material in the prepreg of the described embodiment, other organic fiber materials such as various kinds of polyester fiber, aliphatic polyamide fiber, phenolic fiber, etc. or any inorganic fiber material typified by glass fiber can also be used.

Figure 1A:
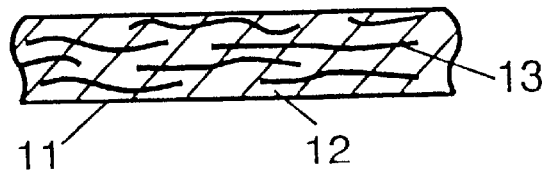
FIGS. 1A, 1B, 1C, 1D, 1E, and 1F are a series of figures depicting a manufacturing process of a double-layered printed wiring board of a first exemplary embodiment of the present invention.
Figure 1B:
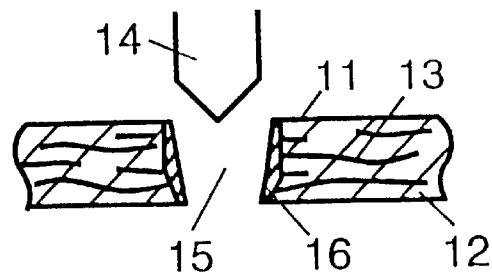

A through hole 15 is formed next by irradiating a laser beam 14 to the substrate material 11 as shown in FIG. 1B. When the substrate material is laser irradiated, the epoxy resin and the aramid fiber in the substrate material are dispersed into the surrounding by evaporation and sublimation. If a condition of the laser irradiation is optimized in a manner as to be described in a succeeding second exemplary embodiment, the aramid fiber 13 around a sidewall of the hole is melted to form a layer of metamorphic substance 16 on the sidewall of the hole. Although molten matter of the aramid fiber constitutes a major constituent of the metamorphic substance layer 16, as described above, the epoxy resin 12 can also be a part of the constituent elements.

Although the metamorphic substance layer 16 is formed as a relatively dense membrane over the inner wall of the through hole 15, it does not necessarily cover the entire wall surface uniformly. In other words, it has been revealed as a result of an experiment conducted by the inventors of this patent that, resin materials contained in conductive paste 17, which is rubbed into the through hole 15 in the next process, are permeated into an interior of the substrate material 11 via the metamorphic layer 16 of the through hole 15 during the subsequent hot-pressing process. On the other hand, conductive particles having diameter of 1 to 5 $\mu$m contained in the conductive paste 17 are not penetrated into the substrate material 11, thereby increasing a density of the conductive materials within the through hole 15 after the hot-pressing.

The phenomenon that the density of the conductive materials within the through hole increase after the hot-pressing, exerts its effect especially when manufacturing a printed wiring board having through holes of a small diameter. That is, it requires conductive paste of low viscosity by increasing an amount of resin content contained in the conductive paste, when the conductive paste is being rubbed into the through hole of small diameter. However, if the resin content in the conductive paste is increased, reliability in electrical contact through the conductive paste decreases. In this respect, the metamorphic substance layer formed according to the present invention improves reliability in the electrical contact, since the density of the conductive materials within the through hole increases after the hot-pressing, due to permeation of the resin component in the conductive paste into the substrate material during the hot pressing process as aforecited. In a word, the metamorphic substance layer for the purpose of preventing permeation of the conductive materials, as described in this invention, needs not be an absolutely perfect layer, but it serves the purpose if it can prevent the conductive materials composing the electric connection means from permeating and dispersing into the substrate material or the surfaces surrounding the through hole.

Figure 1C:
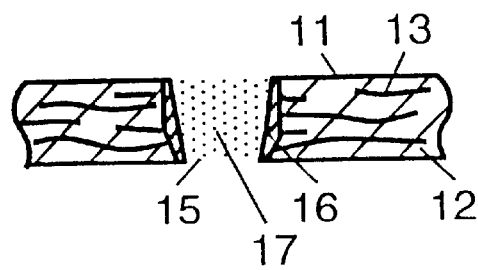
Figure 1D:
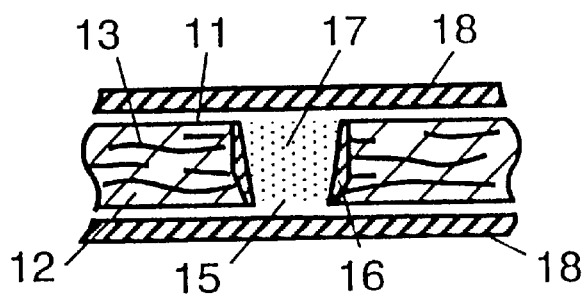
Figure 1E:
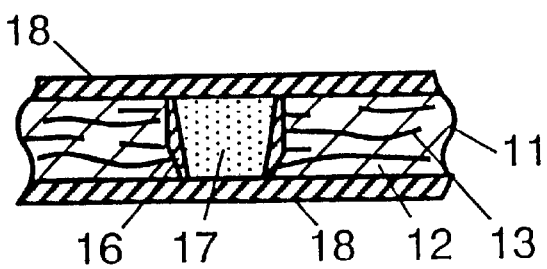

Subsequently, the conductive paste 17 as connection means composed mainly of conductive particles and epoxy resin is filled in the through hole 15, as shown in FIG. 1C, by printing or the similar means. Further, the substrate material 11 is sandwiched with two metal foils 18 on both surfaces, as shown in FIG. 1D, and hot-pressed, so that the substrate material 11 is compression-molded in a direction of thickness. And, as a result, the metal foils 18 on both sides of the substrate material 11 are electrically connected with the conductive particles in the conductive paste 17 as depicted in FIG. 1E.

Figure 1F:
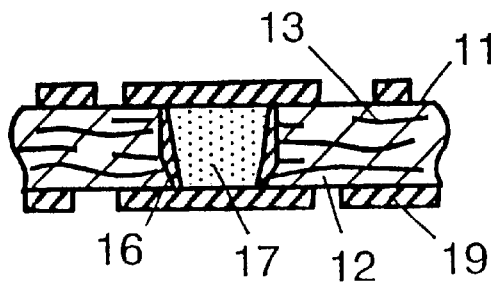

After the foregoing steps, the metal foils 18 on both sides of the substrate material 11 are etched to form a circuit 19 by an ordinary etching process, and a printed wiring board is completed as shown in FIG. 1F.

The present embodiment is especially effective if the substrate material 11 is in a state of prepreg having numerous pores, and this invention is also useful for the printed wiring board utilizing a porous material, which is easy to process with the compression-molding, for the substrate material 11.

Although the embodiment as described above is a structure of the double-layered printed wiring board, it needs no mentioning that a multi-layered printed wiring board can be formed by superposing and hot-pressing a plurality of double-layered printed wiring boards produced by the foregoing manufacturing method with another substrate material filled with the conductive paste in the through hole shown in FIG. 1C.

SECOND EXEMPLARY EMBODIMENT

An experiment was conducted using a carbon dioxide gas laser ("$CO_2$ laser") as a source of the laser beam in the first exemplary embodiment, with various conditions of the laser beam irradiated on the substrate material.

Figure 2A:
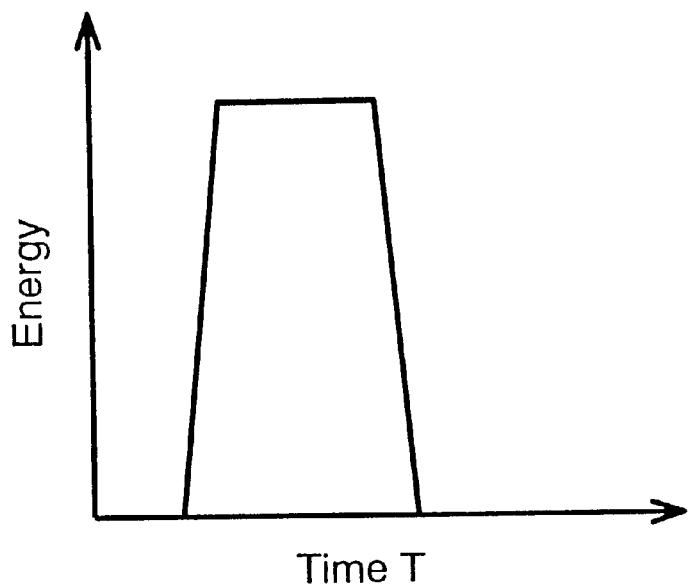
FIGS. 2A and 2B depict a rough figure of a waveform of laser pulse used for the prior art laser processing, and a cross sectional view of a substrate after the processing.
Figure 2B:
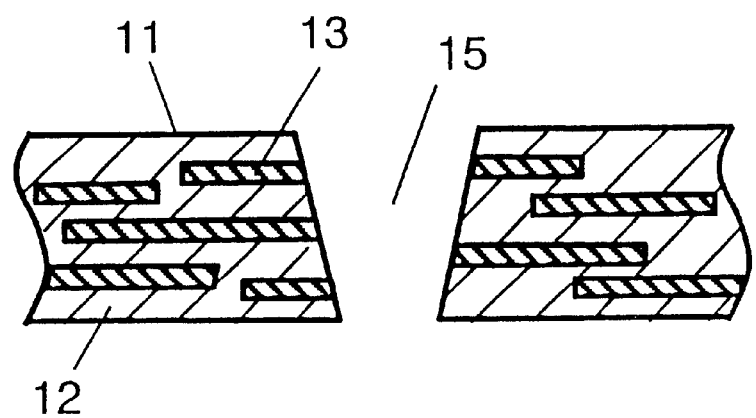

First, a substrate material 11 in a thickness of approximately 200 $\mu$m was irradiated with a laser having a high peak energy, which is the same condition as used for the conventional laser process, for a comparison purpose. A sheared cross sectional surface of the aramid fibers in a cross section of the through hole remained intact, and no effect of the heat was seen in the epoxy resin around the through hole, as shown in FIG. 2B. It was assumed from the above results that the substrate material has evaporated instantaneously.

The same kind of results were observed when rise and fall times of the laser pulse were 20 µs or less, and peak energy of the laser beam was 1000 W or greater. Besides, a laser pulse width needed for making the through hole in a diameter of about 150 µm in the substrate material 11 of about 200 µm thick was approximately 50 µs.

Figure 3A:
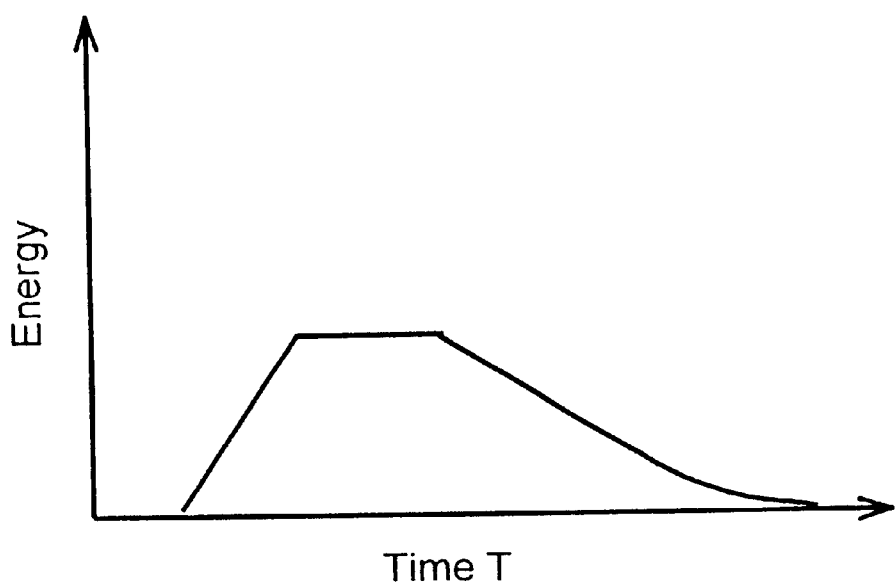
FIGS. 3A and 3B depict a rough figure of a waveform of the laser pulse, of which peak energy is reduced and an irradiating duration is prolonged in the prior art laser processing, and a cross sectional view of a substrate after the processing.
Figure 3B:
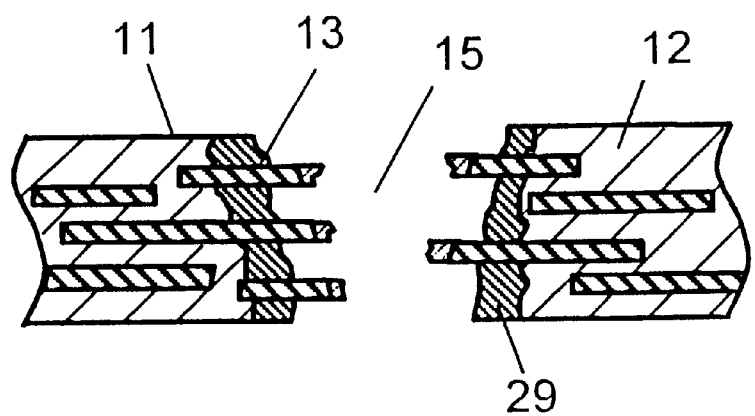

For a further comparison, another experiment was conducted with the laser beam of reduced peak energy. Since the laser beam had low peak energy, it needed to lengthen a half-value width of the irradiating pulse as well as a fall time of the laser beam energy, as shown in FIG. 3A, in order to create the hole having a required diameter. In this comparative example, an inner wall of the through hole 15 became a rough surface due to formation of a carbonized layer 29 on the inner wall of the through hole 15 by carbonization of the aramid fiber 13 and the epoxy resin 12, as shown in FIG. 3B. The same kind of results were also observed when rise and fall times of the laser pulse were 1 ms or longer, and peak energy of the laser beam was 100 W or smaller.

Figure 4A:
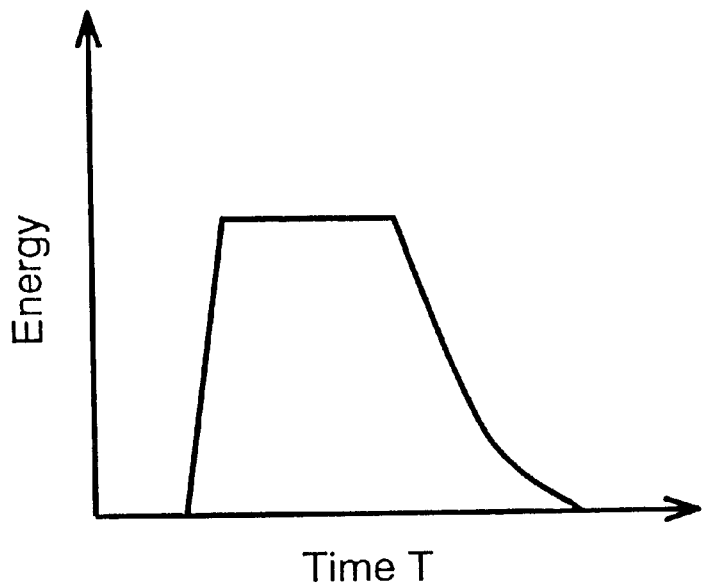
FIGS. 4A and 4B depict a rough figure of a waveform of the laser pulse used in a second exemplary embodiment of the present invention, and a cross sectional view of a substrate after the processing.
Figure 4B:
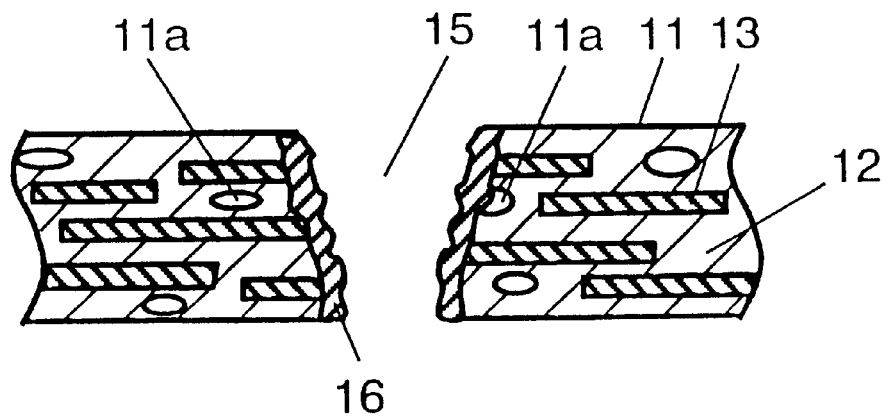
Figure 5A:
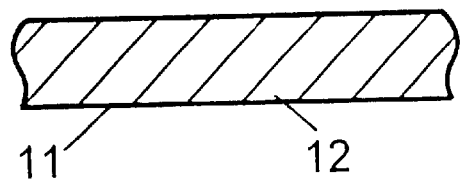
FIGS. 5A, 5B, 5C, 5D, 5E, and 5F are a series of figures depicting a manufacturing process of a double-layered printed wiring board of a third exemplary embodiment of the present invention.
Figure 5B:
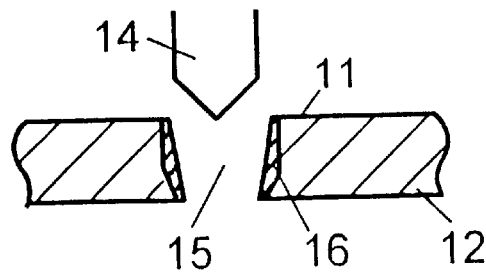
Figure 5C:
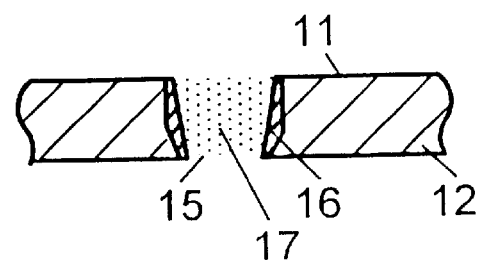
Figure 5D:
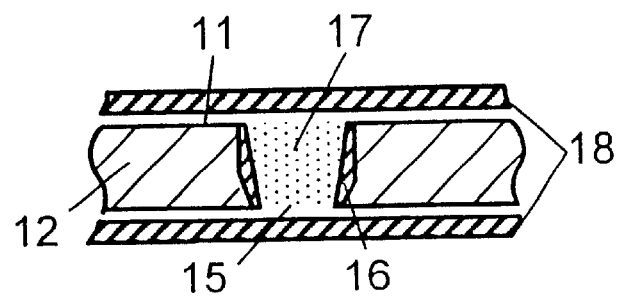
Figure 5E:
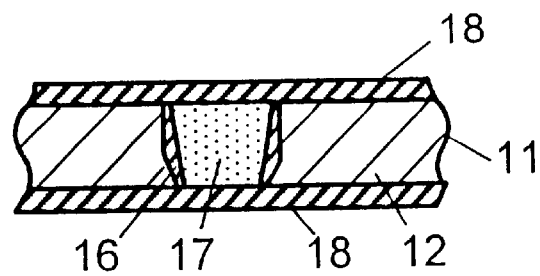
Figure 5F:
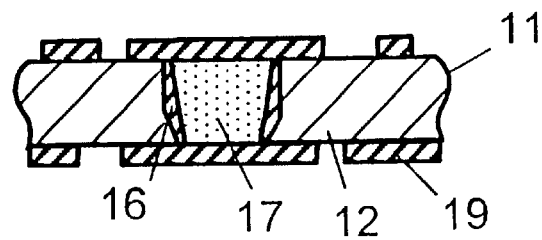

When a laser irradiation was applied in the next step with a condition intermediate between the two preceding comparative examples, as shown in FIG. 4A, a membrane-like metamorphic substance layer 16 was formed on an inner wall of the through hole 15 by molten constituent of the aramid fiber 13, as shown in FIG. 4B. Also, when the substrate material 11 was irradiated with the laser in the above condition, there was not a case where a cavity 11a contained within the substrate material of prepreg exposes through the inner wall of the through hole. In addition, the metamorphic substance layer 16 was efficiently formed, when aramid fibers which start shrinking at the temperature of from 150° C. to 300° C. were used, because shrinkage of the fibers occurred due to the effect of heat by the laser irradiation.

Although it was assumed without doubt that component of the epoxy resin 12 is partly mixed in the metamorphic substance layer 16, it did not influence the effect of the metamorphic substance layer 16 to prevent penetration of the conductive materials. There were also cases that, when other kinds of thermosetting resin, including epoxy resin, are used for the substrate material 11, the thermosetting resin supplements voids developed in the metamorphic substance layer 16 formed by the molten aramid fibers, and exerts a good influence to the penetration preventive effect.

According to the foregoing results, it was found that a condition of the laser irradiation suitable for the present invention lies between 100 W and 1000 W in peak energy of the laser beam, 50 µs and 1 ms in half-value width of the irradiating laser pulse, and 20 µs and 1 ms in fall time of the laser beam. Also, an optimum irradiating condition for the aramid—epoxy substrate in a thickness of 200 µm was 500 W in peak energy of the laser beam, 250 µs in half-value width of the irradiating laser pulse, and 50 µs in fall time of the laser beam, with which a favorable metamorphic substance layer 16 was produced. The satisfactory metamorphic substance layer was obtained in the substrate not only with the aforecited single condition, but also with a condition of 400 W in peak energy of the laser beam, 500 µs in half-value width of the irradiating laser pulse, and 300 µs in fall time of the laser beam, indicating that the satisfactory metamorphic substance layer is obtainable in a wide range of irradiating condition. Incidentally, the aforecited fall time is defined as a time required for the laser energy to decrease to $1/e^2$ (approximately 13.5%, where "e" is the base of the natural logarithms).

It is desirable to determine a minimum energy that does not produce a carbonized layer on the inner wall of the through hole by examining peak power of the laser beam and time of the irradiating pulse in advance for the substrate material to be used, since the optimum processing condition varies, as has been described, depending on material and thickness of the substrate material. A desirable metamorphic substance layer is attained by adjusting the fall time of the laser energy within a range of approximately 50% to 200% of the half-value width of the irradiating pulse, on top of the above.

Since there are often cases wherein adjusting ranges for the peak power and the irradiating pulse time are limited by a structure of the laser generation source, it is effectual to use a mask or the like means in a path of the laser beam in order to adjust a magnitude of energy, as will be described later.

THIRD EXEMPLARY EMBODIMENT

FIGS. 5A through 5F depict cross sectional views showing a manufacturing process of a printed wiring board of a third exemplary embodiment of the present invention. This exemplary embodiment differs from the first exemplary embodiment in that the substrate material 11 is composed solely of the thermosetting resin 12 in a state of the B-stage, without including fiber material for reinforcement. In a material of this kind, there are instances where conductive materials in a through hole disperse into the substrate material 11 nearby the through hole, as the thermosetting resin melts by heat. This dispersion of the conductive materials can be prevented, in the same manner as the first exemplary embodiment, by forming the metamorphic substance layer 16 on the inner wall of the through hole. While it can be assumed that the metamorphic substance layer 16 in the present embodiment is composed of substance produced through a progression of hardening of the thermosetting resin, the similar effect can be exerted with certain thermoplastic resins in some instances.

FOURTH EXEMPLARY EMBODIMENT

Figure 6:
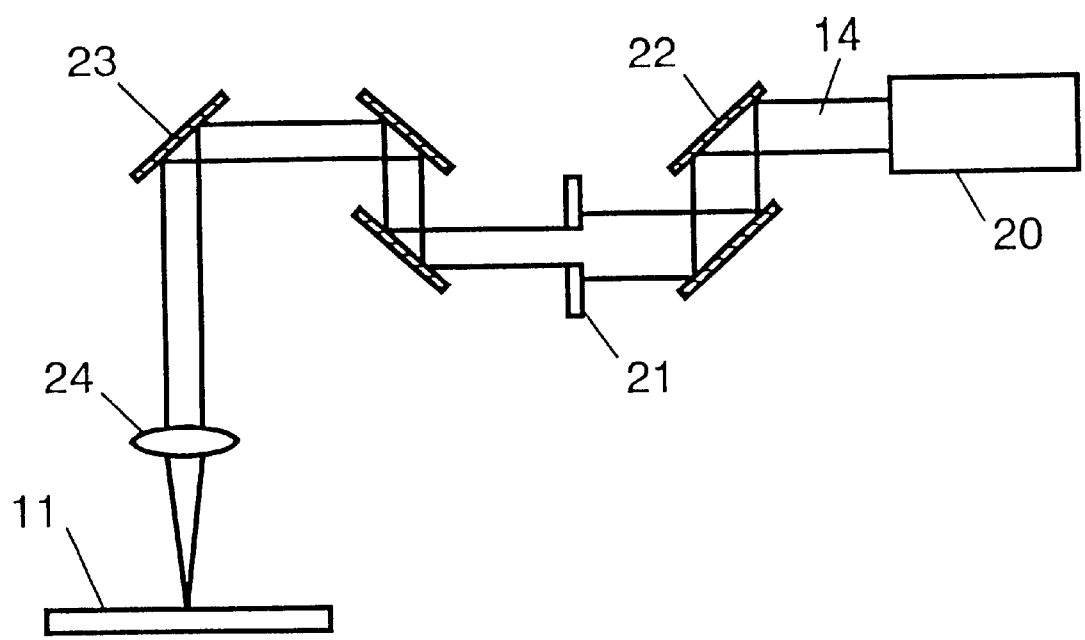
FIG. 6 is a rough structural drawing depicting a manufacturing apparatus of a printed wiring board of a fourth exemplary embodiment of the present invention.

FIG. 6 is a brief structural drawing depicting a manufacturing apparatus for a printed wiring board of the present invention. In FIG. 6, a laser beam 14 emitted by a laser beam oscillator 20 is adjusted to a required beam diameter by introducing to a mask 21 via a total reflection miller 22, etc, and irradiated on a substrate material 11 by a condensing lens 24 after passing through a scanner means 23 for scanning the laser beam. A galvanomiller is generally used for the scanner means 23. The substrate material 11 is moved by an X-Y stage or the like means (not shown in the figure) so that a targeted position for irradiation is irradiated with the laser.

Figure 7A:
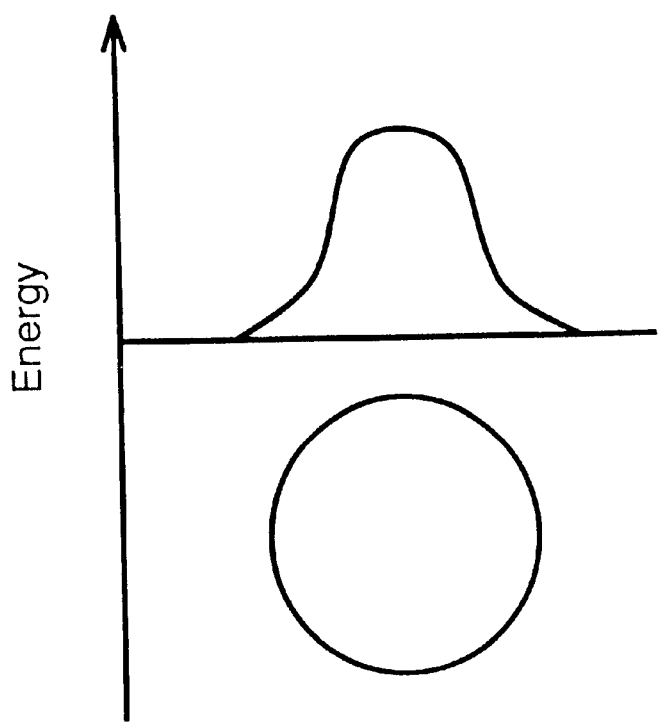
FIGS. 7A and 7B depict a figure showing an energy distribution of the laser used in the prior art laser processing, and a cross sectional view of the processed portion.
Figure 7B:
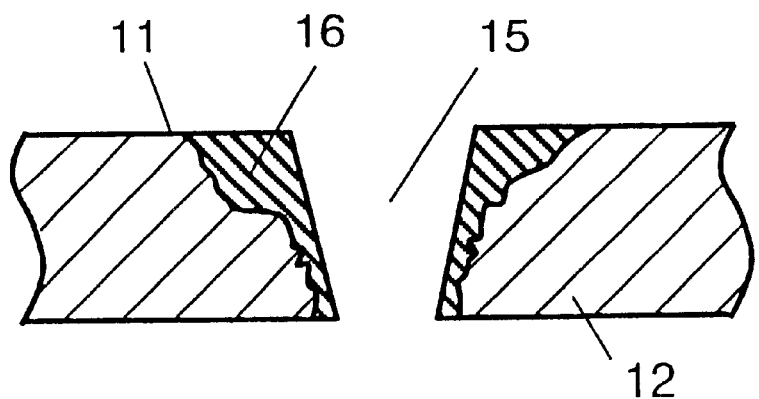
Figure 8A:
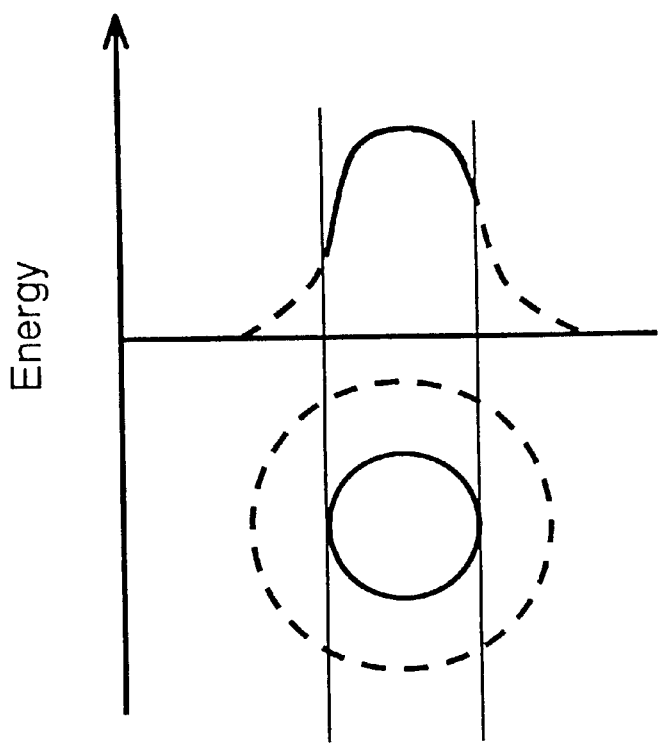
FIGS. 8A and 8B depict a figure showing an energy distribution of the laser used in the fourth exemplary embodiment of the present invention, and a cross sectional view of the processed portion.
Figure 8B:
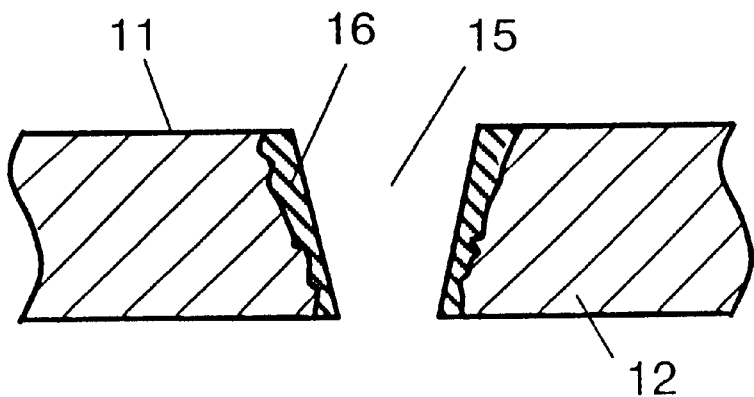

With reference to FIG. 7 through FIG. 9, an irradiating condition, etc. of the laser beam will be described hereinafter.

For a comparison purpose, FIG. 7 depicts a metamorphic substance layer, which is formed when an ordinary unprocessed laser beam is used. The ordinary laser beam has energy distribution as shown in FIG. 7A in that the energy decreases gradually toward a radial direction, with a center being the highest. When the laser beam as shown here is irradiated on the substrate material 11, a through hole 15 as well as a metamorphic substance layer 16 in vicinity of the through hole 15 are formed in the substrate material 11 due to a thermal effect of the laser beam. However, since the energy is small around the perimeter of the laser beam, the substrate material 11 can not be eliminated by evaporation, thereby leaving a thick metamorphic substance layer on the surface area of the substrate material 11 surrounding the through hole 15.

The thick metamorphic substance layer existing in the substrate material 11 impedes a hot pressing process, and a resultant insufficiency of compression in the through hole area reduces reliability of the electrical contact of the electrical connection means formed in the through hole 15. Adoption of the mask 21 is effective in solving this problem, as it cuts off the low energy area of the laser beam, as shown in FIG. 6.

Figure 9A:
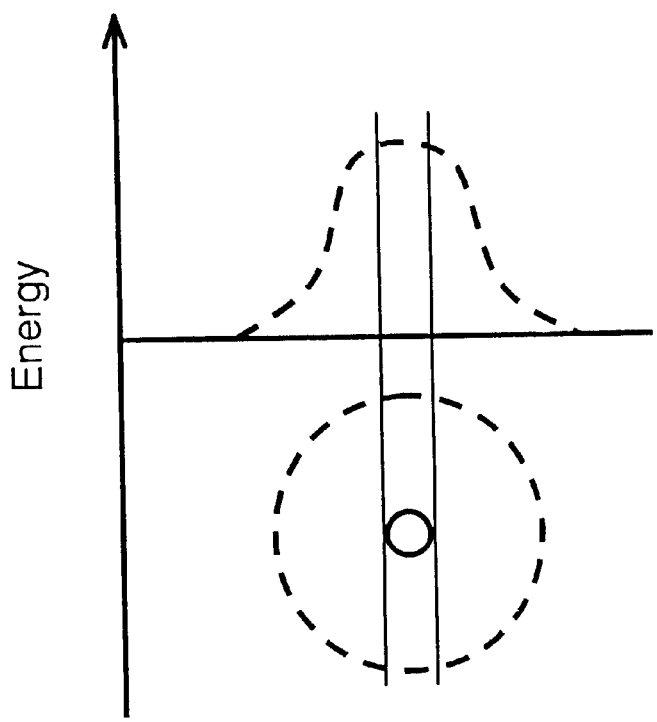
FIGS. 9A and 9B depict a figure showing an energy distribution of the laser, when the laser beam is excessively choked in the fourth exemplary embodiment of the present invention, and a cross sectional view of the processed portion.
Figure 9B:
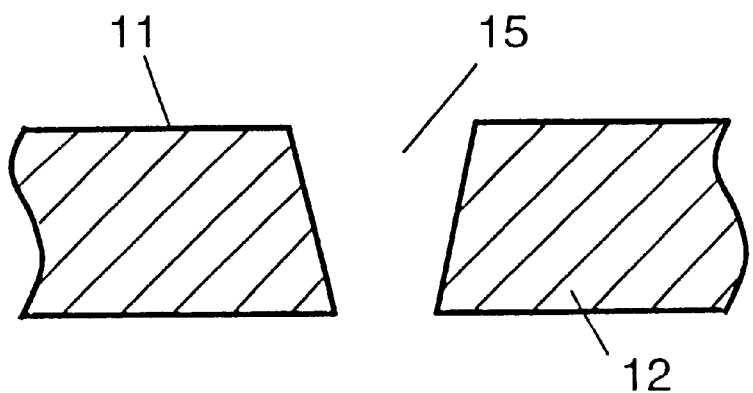

As shown in FIG. 8A, properly cutting off the part of low energy around the perimeter of the laser beam with the mask can realize formation of a thin and uniform metamorphic substance layer 16 around the inner wall of the through hole 15. Furthermore, a result is shown in FIG. 9, in which the laser beam is excessively cut off. As shown in FIG. 9B, the substrate material 11 does not develop a metamorphic substance layer, when it is irradiated with only a part of high energy in the center of the laser beam shown in FIG. 9A. Consequently, conductive materials composing the electrical connection means disperse or permeate into the substrate material 11 in vicinity of the through hole 15.

According to an experiment conducted by the inventors, the unsatisfactory phenomenon as shown in FIG. 9 was observed when 98% or more of the laser beam around the perimeter was cut off. It was also observed, however, when an irradiating time of the laser was prolonged, the hole diameter increased gradually due to the effect of heat from the laser beam 14, and the metamorphic substance layer 16 of the present invention was eventually formed on the inner wall, even if perimeter of the laser beam was cut off by 98% or more.

From a result of the experiment, it was found that a good metamorphic substance layer is formed on the inner wall of the through hole 15, if the laser beam is irradiated on the substrate material 11 for a duration that produces a diameter of the through hole 15 in a range of 110% to 300% of a diameter of the laser beam. In other words, a favorable metamorphic substance layer can be formed with an irradiation of a laser of only the high energy portion, if the laser beam in a diameter of approximately 30% to 90% of the designed hole diameter is irradiated.

Although the embodiment as described above is a case that the laser beam is adjusted with the mask 21 as shown in FIG. 6, the mask 21 may not be needed in certain instances where quality of the laser beam oscillator is exceedingly well. This is because the part carrying a small energy around perimeter of the laser beam has an amount of energy suitable for the formation of metamorphic substance layer, in these instances.

As has been described in the foregoing exemplary embodiments, a magnitude of the laser irradiation required for producing the favorable metamorphic substance layer is the sum of a minimum energy necessary to form a through hole or a blind hole, and an energy to form the metamorphic substance layer. It is effective, as concrete means for applying the energy to form the metamorphic substance layer, to either prolong the irradiation time or a fall time of the laser pulse, or utilize an energy density distribution of the laser beam.

FIFTH EXEMPLARY EMBODIMENT

Figure 10A:
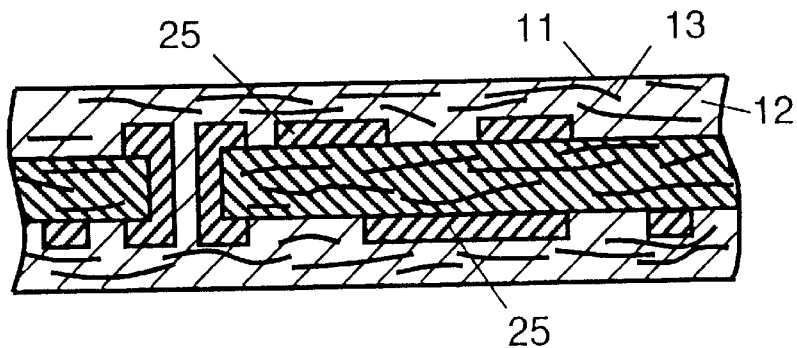
FIGS. 10A, 10B, 10C, and 10D are a series of figures depicting a manufacturing process of a multi-layered printed wiring board of a fifth exemplary embodiment of the present invention.
Figure 10B:
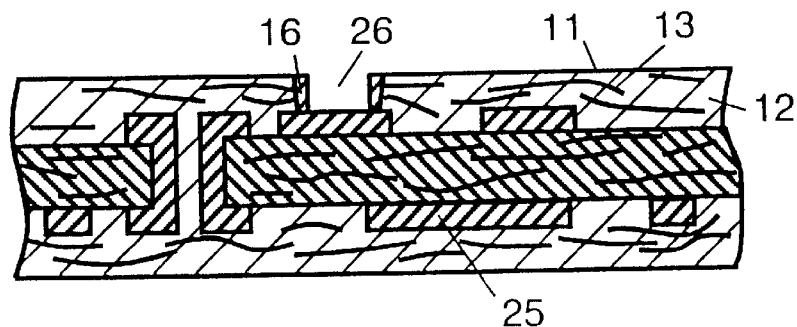

FIGS. 10A through 10D depict cross sectional views of an area around a blind hole showing a manufacturing process of a multi-layered printed wiring board of a fifth exemplary embodiment of the present invention. In this exemplary embodiment, a material constructed of a double-layered printed wiring board pre-formed with an electric circuit 25 superposed by an insulation layer 12 composed of aramid fiber and thermosetting resin, as shown in FIG. 10A, is used for the substrate material 11. Next, a blind hole 26 is formed by irradiating a laser beam (not shown) on the insulation material in an area over the electric circuit in the substrate material 11, as shown in FIG. 10B. A metamorphic substance layer 16 can be produced on an inner wall of the blind hole 26 by properly setting an irradiating condition of the laser during this process.

Since metal foil has low absorption coefficient for the ordinary laser beam, the laser beam is able to form the blind hole only in the insulation material 12 without impairing the metal foil in the perforating process. A variety of gas lasers typified by the $CO_2$ laser, solid-state lasers represented by the YAG laser, a variety of excimer lasers, and the like can be utilized for a laser source in the present embodiment.

Figure 10C:
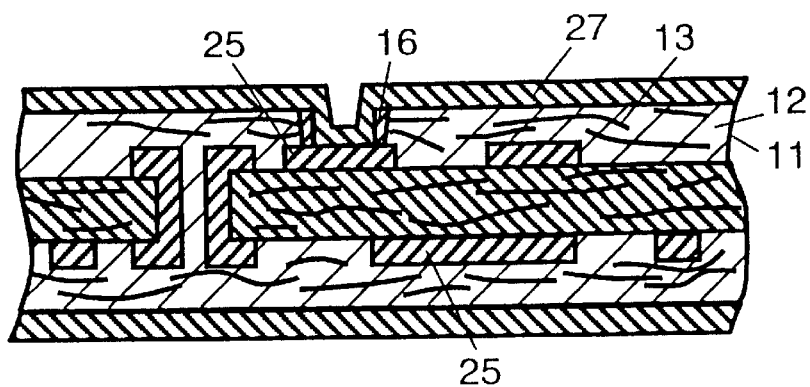
Figure 10D:
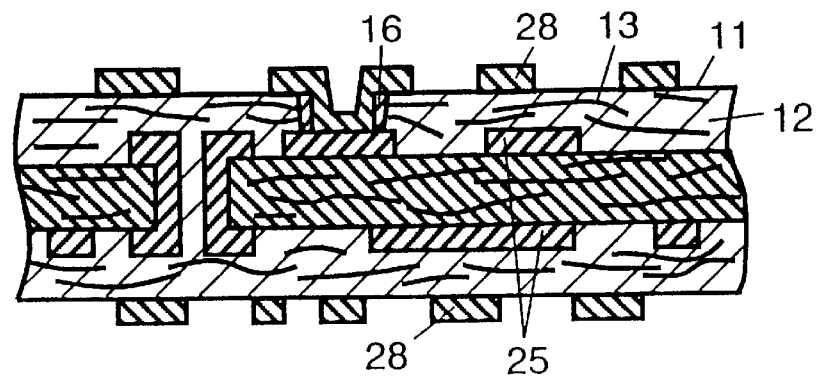

A metal layer 27 for an outer layer circuit connected with the inner layer circuit 25 is formed by the known methods of electroless plating and electroplating on a surface of the substrate material 11 formed with the metamorphic substance layer 16, as shown in FIG. 10C. And further, the outer layer circuit is formed with a patterning process so as to complete a four-layered printed wiring board as shown in FIG. 10D.

The metamorphic substance layer 16 of the present invention effectively prevents plating solution from permeating into the substrate material during the plating process.

SIXTH EXEMPLARY EMBODIMENT

Figure 11A:
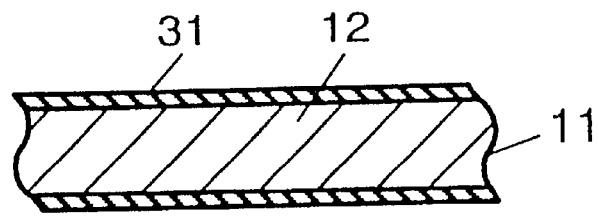
FIGS. 11A, 11B, 11C, and 11D are a series of figures depicting an intermediate manufacturing process of a printed wiring board of a sixth exemplary embodiment of the present invention.
Figure 11B:
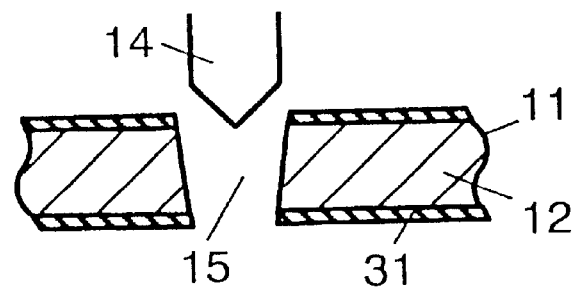

FIGS. 11A through 11D depict cross sectional views of an area around a through hole showing a manufacturing process of a multi-layered printed wiring board of a sixth exemplary embodiment of the present invention. In this exemplary embodiment, a substrate material 11 in a board-form is made of thermosetting resin 12, which is laminated on both surfaces with resin films 31 such as polyethylene terephthalate as shown in FIG. 11A. Next, a through hole 15 is formed as shown in FIG. 11B, by a laser beam 14.

Figure 11C:
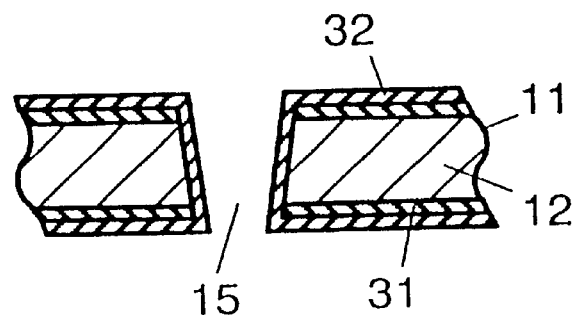
Figure 11D:
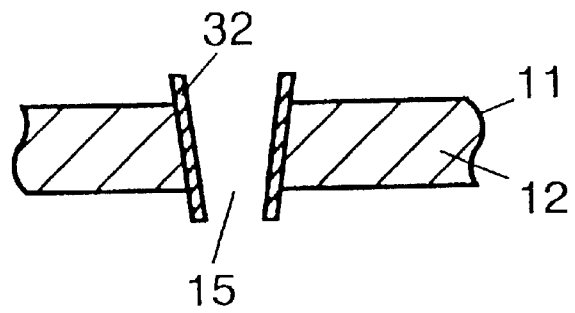

A resin layer 32 is then formed by either dipping or spraying methods on the surface of the substrate material 11 and inner wall of the through hole 15 as shown in FIG. 11C. Thermosetting resin or the like material diluted by solvent is suitable for a material of the resin layer 32. It is desirable to increase a hardness of the resin layer 32 by removing the solvent in a drying furnace after the substrate material 11 is coated with the resin solution. The substrate material 11 formed with the resin layer 32 on only the inner wall of the through hole 15 is thus obtained by removing the resin film 31 as shown in FIG. 11D.

The resin layer 32 as is formed in this manner has the same function as the metamorphic substance layer 16 described in the third exemplary embodiment of the present invention, which is capable of preventing the conductive materials composing an electrical connection means from dispersing in vicinity of the through hole 15 in the succeeding processes. Although the described embodiment utilizes a resin film for preventing dispersion of the conductive materials composing the electrical connection means, this does not limit to resin film as the material having this nature of function, and the same effect is attainable with a membrane formed on the inner wall of the through hole by spattering or the like method.

SEVENTH EXEMPLARY EMBODIMENT

Figure 12A:
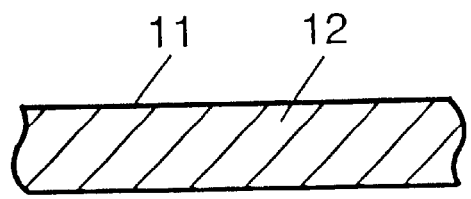
FIGS. 12A, 12B, and 12C are a series of figures depicting an intermediate manufacturing process of a printed wiring board of a seventh exemplary embodiment of the present invention.
Figure 12B:
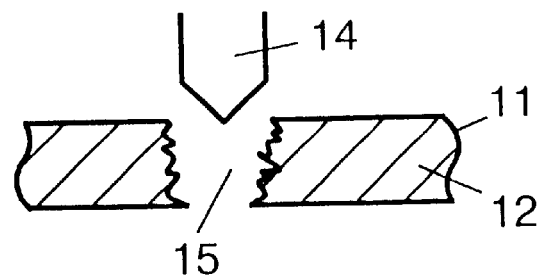
Figure 12C:
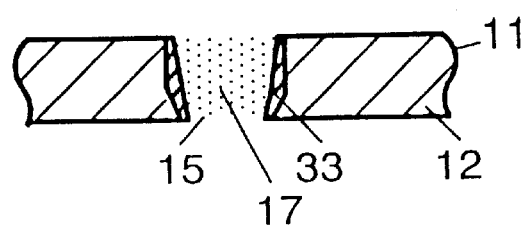

FIGS. 12A through 12C depict cross sectional views of an area around a through hole showing a manufacturing process for a multi-layered printed wiring board of a seventh exemplary embodiment of the present invention. In this exemplary embodiment, a substrate material 11 in a board-form is made of thermosetting resin 12 in a state of the B-stage. A through hole 15 is formed in the substrate material 11 using a laser beam 14 as shown in FIG. 12B. Then, conductive paste 17 is filled in the through hole 15 as shown in FIG. 12C.

The present embodiment is peculiarized by a hardening agent for the thermosetting resin, which constitutes the substrate material 11, added to the conductive paste 17. The hardening agent for the thermosetting resin causes a reaction with the thermosetting resin 12 in a state of the B-stage to form a hardened resin layer 33 in vicinity of an inner wall of the through hole 15. The hardened resin layer 33 can be formed on the inner wall of the through hole 15 before the substrate material hardens, by adding into the conductive paste 17 the hardening agent that has a higher reactivity than a hardening agent in the thermosetting resin 12 in a state of the B-stage. The hardened resin layer 33 exerts a good effect to prevent dispersion of the conductive materials in the conductive paste to an interior of the substrate material.

EIGHTH EXEMPLARY EMBODIMENT

Figure 13:
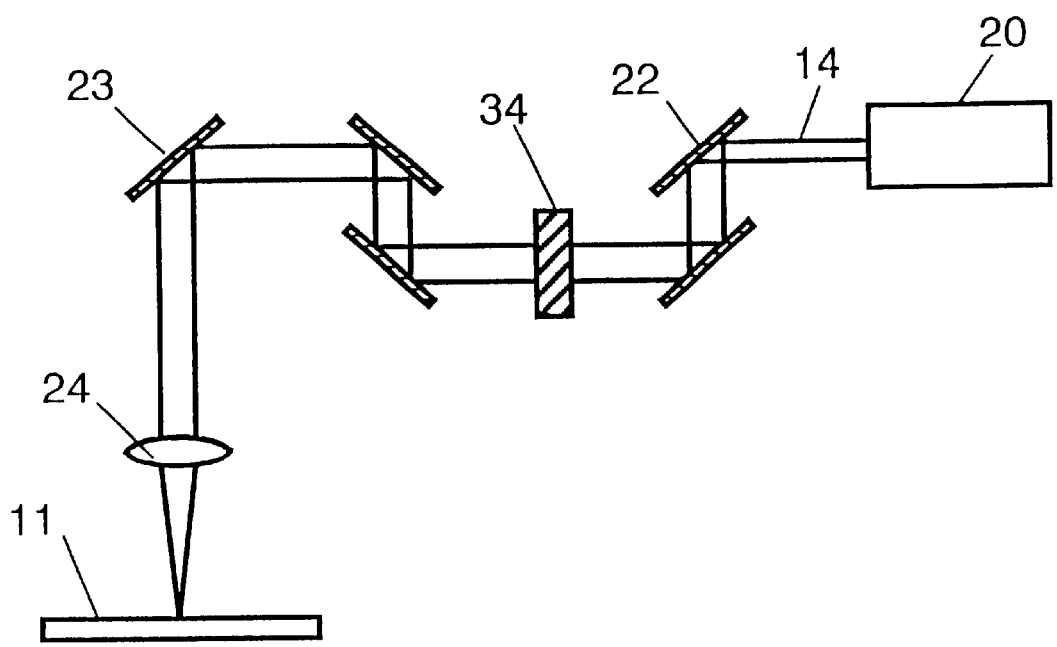
FIG. 13 is a rough structural drawing depicting a manufacturing apparatus of a printed wiring board of an eighth exemplary embodiment of the present invention.

FIG. 13 is a brief structural drawing depicting a manufacturing apparatus for a printed wiring board of an eighth exemplary embodiment of the present invention. A laser beam 14 induced by a laser beam oscillator 20 enters into a shutter 34 via a total reflection miller 22, etc, and is irradiated on a substrate material 11 by a condensing lens 24 after passing through a scanner means 23. A pulse width of the laser beam 14 to be irradiated on the substrate material 11 is adjustable to a desired value by opening and closing the shutter 34. The scanner means 23, the substrate, etc. shown in FIG. 13 move in the same manner as in the case of the fourth exemplary embodiment.

With regard to controlling an irradiation time of the laser beam, although it is feasible to adjust a pulse width of the laser beam 14 by varying a pulse width of an oscillation dictating signal to be input to the laser beam oscillator 20, the shutter 34 gives a higher degree of freedom in adjusting the pulse width. It is even more preferable to control the laser beam 14 by dictating two parameters, i.e. the pulse width of the oscillation-dictating signal, and opening and closing times of the shutter 34.

A through hole having a metamorphic substance layer suitable for the purpose of this invention was attained, when a laser beam was irradiated for the time necessary to obtain the through hole in diameter of 110% to 300% of the laser beam diameter, in addition to the time needed to eliminate the substrate material 11 irradiated with the laser beam 14 using the manufacturing apparatus for printed wiring boards of the present embodiment.

Furthermore, a through hole having a metamorphic substance layer suitable for the purpose of this invention was also attained, when a pulse width of the laser beam irradiated on the substrate material 11 was set within 50 µs and 1 ms in half-value width.

NINTH EXEMPLARY EMBODIMENT

Figure 14:
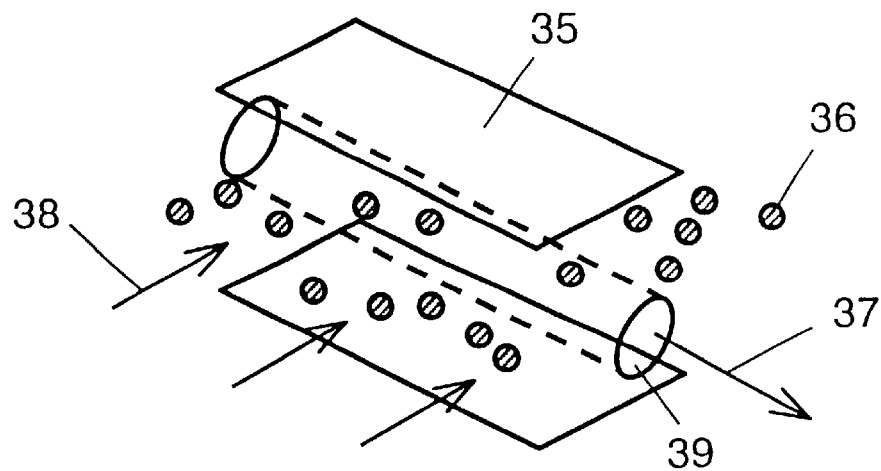
FIG. 14 is a perspective view depicting a laser oscillator for the manufacturing apparatus of a printed wiring board of a ninth exemplary embodiment of the present invention.
Figure 15A:
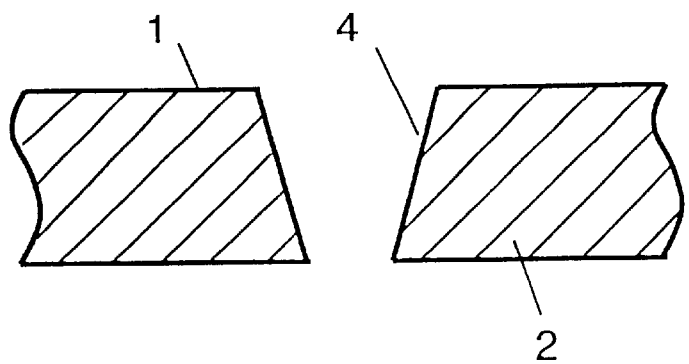
FIGS. 15A and 15B are a series of figures depicting an intermediate manufacturing process of a printed wiring board of the prior art.
Figure 15B:
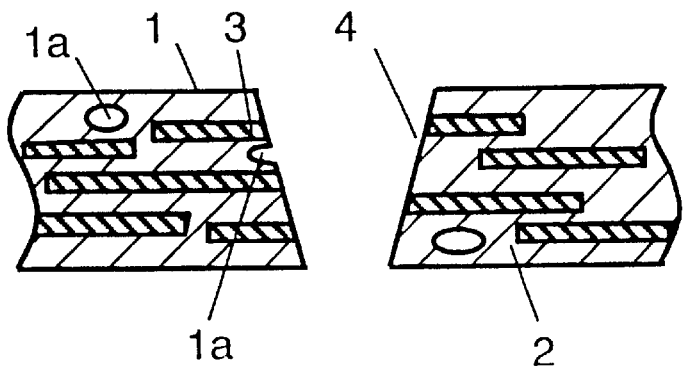
Figure 16A:
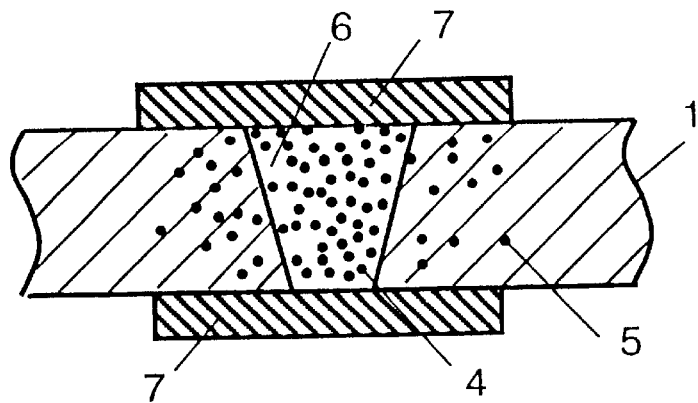
FIGS. 16A and 16B depict cross sectional views of double-layered printed wiring boards of the prior art.
Figure 16B:
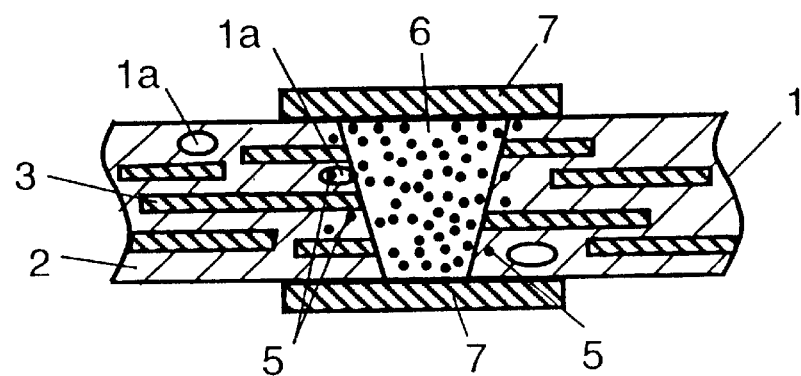
Figure 17:
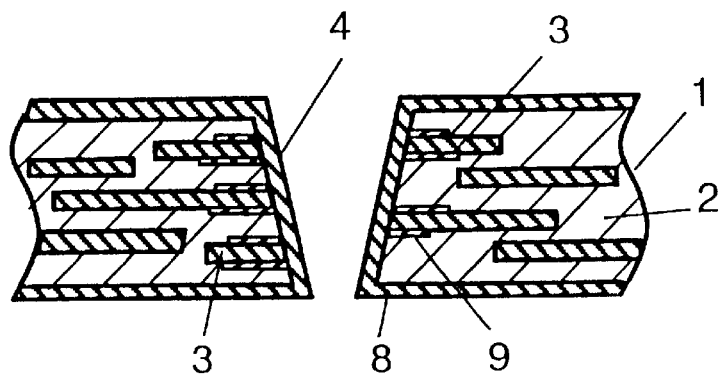
FIG. 17 depicts a cross sectional view of a double-layered printed wiring board of the prior art.

FIG. 14 is a perspective view depicting a laser oscillator of a manufacturing apparatus for a printed wiring board of an ninth exemplary embodiment of the present invention. In the laser oscillator, a voltage is applied between an upper and a lower discharge electrodes 35, and laser medium gas flows at a constant velocity in a direction of the gas flow 38. A laser beam is generated from gas molecules 36 excited between the electrodes, emitted as a laser beam 37 after amplified in an aperture 39. For this reason, an oscillation of the laser beam continues until the excited gas molecules are expelled by the gas flow from the aperture space, even after the discharge voltage is turned off. The fall time can be controlled by taking advantage of this principle. An experiment yielded a favorable metamorphic substance layer around a through hole perforated by the laser, since the fall time of the laser beam became 300 µs, when the discharge electrodes were 50 mm in width, the aperture was positioned in the center of the electrodes, and a velocity of the gas was set for 80 m/s.

What is claimed is:

1. A printed wiring board comprising:

a plurality of metal foils;

a substrate composed of at least one substrate material;

an electrical connection means comprising a conductive material for electrically connecting a plurality of electric circuits formed in said plurality of metal foils which extends through a through hole or a blind hole which is formed in said substrate; and a prevention means provided on an inner wall of said through hole or blind hole for preventing said conductive material from dispersing or permeating into an interior of said substrate or over a surface thereof;

wherein said substrate comprises a composite material of woven fiber or non-woven fiber, and a resin;

wherein a major constituent of said woven fiber or non-woven fiber is organic fiber material; and wherein said prevention means comprises a layer of metamorphic substance made by transmuting one or more constituent elements of said substrate.

2. The printed wiring board according to claim 1, wherein a major constituent of said resin is thermosetting resin.

3. The printed wiring board according to claim 1, wherein said organic fiber material is aromatic polyamide.

4. The printed wiring board according to claim 1, wherein said layer of metamoprhic substance is formed on an inner wall of said through hole or said blind hole and comprises a transmuted component produced from melting of said woven fiber or non-woven fiber components of the composite material.

5. The printed wiring board according to claim 1, wherein said layer of metamorphic substance is formed on an inner wall of said through hole or said blind hole and comprises a transmuted component produced from melting of said woven fiber or non-woven fiber components of the composite material and a transmuted component of said resin.

6. The printed wiring board according to claim 1, wherein said electrical connection means comprises parts containing conductive particles filled in the through hole or the blind hole.

7. The printed wiring board according to claim 1, wherein said electrical connection means comprises metal parts on said prevention means.

* * * * *